US007372931B2

(12) United States Patent
Wood

(10) Patent No.: US 7,372,931 B2
(45) Date of Patent: May 13, 2008

(54) UNIT INTERVAL DISCOVERY FOR A BUS RECEIVER

(75) Inventor: Glenn Wood, Colorado Springs, CO (US)

(73) Assignee: Agilent Technologies, Inc., Santa Clara, CA (US)

(*) Notice: Subject to any disclaimer, the term of this patent is extended or adjusted under 35 U.S.C. 154(b) by 841 days.

(21) Appl. No.: 10/815,139

(22) Filed: Mar. 31, 2004

(65) Prior Publication Data

US 2005/0220238 A1    Oct. 6, 2005

(51) Int. Cl.
*H03M 71/00* (2006.01)
(52) U.S. Cl. ...................................... 375/360
(58) Field of Classification Search ................. 375/360
See application file for complete search history.

(56) References Cited

U.S. PATENT DOCUMENTS 5,138,320 A    8/1992 Ngo et al.

| 5,646,565 | A  | * | 7/1997 | Tukidate ...................... 327/174 |
| 6,856,206 | B1 | * | 2/2005 | Perrott ......................... 331/25 |
| 7,164,742 | B2 | * | 1/2007 | McLeod ...................... 375/355 |
| 7,180,340 | B2 | * | 2/2007 | Jung et al. ................... 327/116 |

FOREIGN PATENT DOCUMENTS

| JP | 57010465 A | 1/1982 |
| JP | 60164257 A | 8/1985 |

* cited by examiner

*Primary Examiner*—Mohammed Ghayour
*Assistant Examiner*—Nurul M Matin

(57) ABSTRACT

A bus data signal is applied to a tapped data delay line. The various increasingly delayed data values present at the taps of the delay line are clocked into respective cells of a sticky ZEROs register (SZERO) previously initialized to all ONES, and into respective cells of a sticky ONES (SONE) register previously initialized to all ZEROS. SZERO measures the unit interval of a ONE.

11 Claims, 1 Drawing Sheet

UNIT INTERVAL DISCOVERY FOR A BUS RECEIVER

BACKGROUND OF THE INVENTION

Consider a digital system wherein a communications path, such as a bus, transmits both a clock and some accompanying data. Typically, the phase of the clock is delayed by a half-cycle of the data, so that the data has time to set up, whereupon a transition in the clock indicates that it is time to capture the value of the data, which might be a logical ONE or a logical ZERO. As is well known, temperature variations, power supply drift, higher speeds, longer data paths, wider bus widths and inter-symbol interference all conspire to degrade timing and voltage margins, leading to various strategies of compensation. One such strategy is to periodically train the receiver mechanism by transmitting a known pattern of data, whereupon the receiver adjusts itself to register the correct results. Another is to continuously monitor transitions in the data and deliberately variously delay the clock transition by an amount that produces the needed half cycle.

These techniques can benefit from a first hand knowledge of the unit interval of the data signals on the bus. The unit interval (UI) is the length of a data bit, or the transition-to-transition cycle time, and is also subject to variations influenced by variations in temperature, power supply voltages, etc. It can also happen that UI(ONE) [the unit interval of a ONE] might not be the same as UI(ZERO) [the unit interval of a ZERO]. Thus, it would be desirable if the receiver could periodically, or on an as-needed basis, discover the actual unit intervals UI(ONE) and UI(ZERO), and do so in a fashion that lends itself to subsequent identification of the points in time that are at the middle of the effective (or equivalent) unit interval (say, of an average of UI(ONE) and UI(ZERO), in order to clock the data capture mechanism at exactly those times). A worthy goal, indeed, but it requires that we actually perform an onboard measurement of UI(ONE) and UI(ZERO). What to do?

SUMMARY OF THE INVENTION

A bus data signal, whose unit interval may be taken as representative of the various other data signals of the bus, is applied to a tapped data delay line of selected step sizes and whose overall delay is at least one (maximum) unit interval. For convenience we shall call such a tapped delay line a "Time Ruler." The various increasingly delayed data values present at the taps of the Time Ruler are clocked into respective cells of a sticky ZEROs register (SZERO:[1-k]) previously initialized to all ONEs, and into respective cells of a sticky ONEs register (SONE:[1-k]) previously initialized to all ZEROs. The sticky ZEROs register SZERO measures UI(ONE), which is the unit interval of a ONE. Assuming that the active edge of a bus signal is the rising edge, the inversion of the selected data signal is used to clock SZERO, while the non-inverted signal clocks SONE. Over a period of time following initialization, the data signal can be expected to experience isolated ONEs (i.e., a single ONE with ZEROs before and after) and similarly isolated ZEROs (i.e., a single ZERO with ONEs before and after). A ONE to ZERO transition in the data will clock any far-to-the-right ZEROs in the Time Ruler into SZERO, which become sticky and trim the indication of UI(ONE) in the left-most and remaining initial ONEs. In similar fashion, a ZERO to ONE transition in the data will clock any far-to-the-right ONEs in the Time Ruler into SONE, which become sticky and trim the indication of UI(ZERO) in the left-most and remaining initial ZEROs. In due course the Unit Interval indicating contents of SZERO and SONE are unloaded into a processing circuit and utilized.

DESCRIPTION OF A PREFERRED EMBODIMENT

Figure 1:
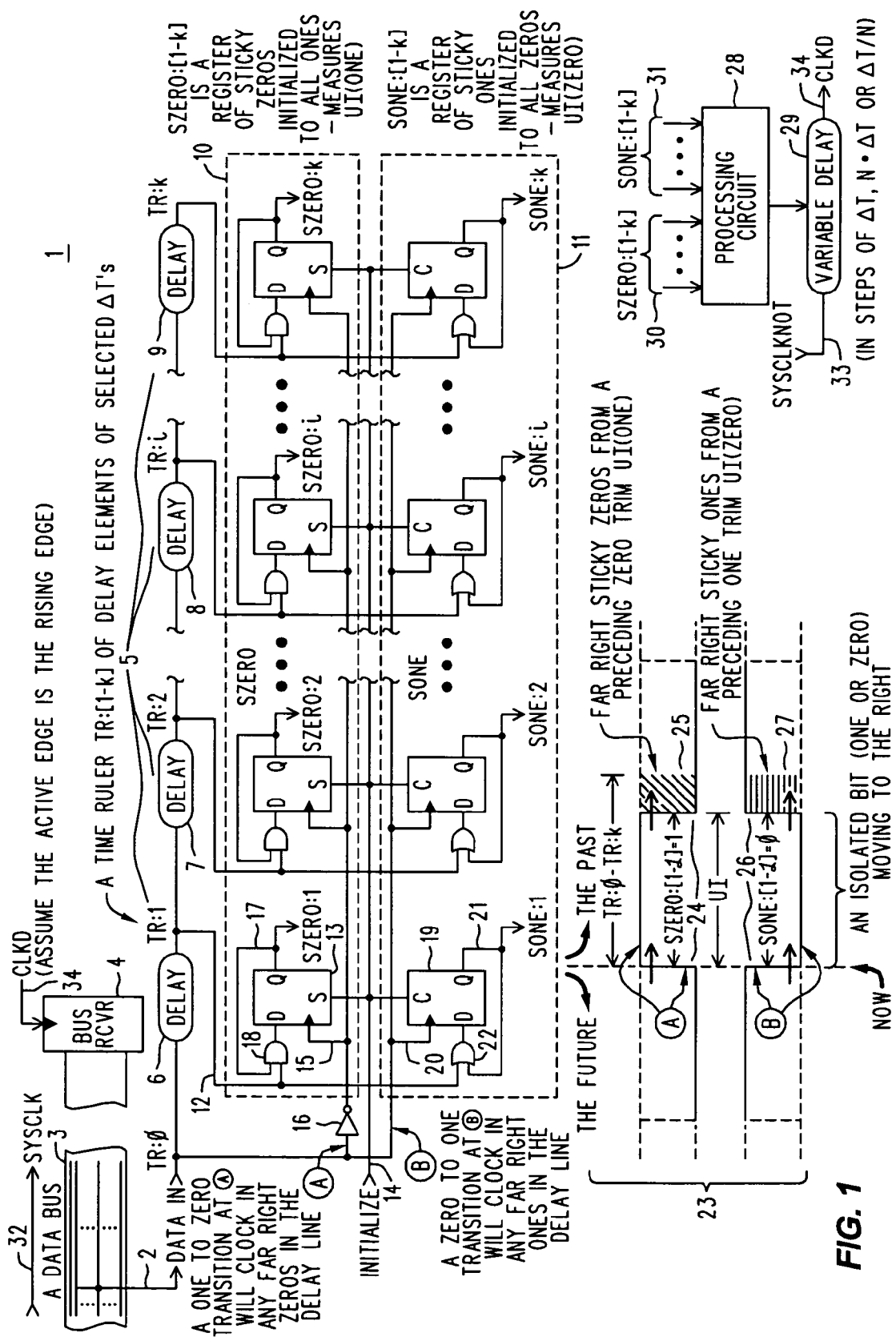
FIG. 1 is a simplified block diagram of a circuit for discovering Unit Intervals.

Refer now to FIG. 1, wherein is shown a simplified block diagram of a circuit arrangement 1 for discovering the Unit Interval of a ONE bit [UI(ONE)] and also that of a ZERO bit [UI(ZERO)] for a signal 2. The signal 2 might be a particular individual signal whose UI is of interest, or it might be, as is shown in the figure, one that is taken as representative of circumstances associated with an entire bus 3 whose signals are to be received by a BUS RECEIVER 4 that is clocked by a signal CLKD 34. In any event, the supposition is that some good can come from a knowledge of the particular UI(ONE) and UI(ZERO) that are occurring at any given period of time, say, by adjusting a delay associated with CLKD. Our interest here is not so much with what to do with such Unit Interval information, as it is with how to find it in the first place.

Now, the measurement of pulse width or period information in microseconds or nanoseconds has been the stock in trade of electronic counters of the bench top test equipment variety for at least fifty years. It is not so much that such a measurement is, in principle, either difficult to appreciate or to realize. On the other hand, a counter is a rather bulky affair, and even if miniaturized would not be an appropriate thing for inclusion in the architecture of an IC (Integrated Circuit), even of the VLSI (Very Large Scale Integration) variety. What is more, we could benefit from answers that are on the order of a few percent to say, ten or even fifteen percent, while most counter architectures are built around a very stable accurate oscillator and a measurement scheme that, today anyway, regards answers in the PPM (Parts Per Million) range as only mediocre accuracy.

In contrast, we need something that does not have a huge foot print within the overall architecture of the IC, provides enough resolution to be useful, and does not depend upon an absolute timing standard.

To that end, we apply the signal 2 to a Time Ruler 5 composed of a number of cascaded delay elements (6, 7, 8, . . . 9). These delay elements may be any of the well-know sort that delay an edge for a digital signal, such as each delay element being a series of one or more cascaded buffers. There are also ramp and threshold style delay elements that are well known in the art. Any of these may be employed so long as one is aware of any differences in delay for rising edges as opposed to falling edges. As will become clear as the explanation proceeds, however, such differences in delay need not be fatal (given the relatively low degree of accuracy we seek, it may be possible to simply ignore such differences), or it can be arranged that their effect is nearly removed by a "common mode" method of application. We (for purposes of initial explanation) prefer that each of the delay elements in the Time Ruler create the same delay ($\Delta T$) as the others, and that each provides a non-inverted output. Later, we shall discuss how the leading, or first, delay element can have a substantially larger delay than the others.

In any event, the total amount of delay from input to final output at the end of the Time Ruler is at least as long as the longest expected Unit Interval.

So, let us: (1) Say that there are k-many delay elements; (2) Call the signal selected for application to the Time Ruler 5 "DATA IN"; and (3) Designate the various delayed versions, register style, as TR:1, TR:2, . . . TR:i, . . . TR:k (TR:0 is the same as DATA IN). The entire collection could be referred to as TR:[0-k]. Thus, TR:0 is simply DATA IN, and the various TR:i are the k-many successively delayed signals (i.e., instances of some earlier DATA IN). Owing to the nature of the relationship between these signals, they are not, as would be the case for an actual register, all available at once at a single time, but instead have values that are quite time-dependent within even a single clock cycle. Nevertheless, we find the register-style notation useful anyway, providing the afore-mentioned circumstance is remembered.

Now consider two registers, SZERO 10 and SONE 11, whose latching elements are "sticky" for ZEROs and ONEs, respectively, and that are initialized and clocked as will be described. Each register has as many latching elements, or cells, as there are delay elements. That is, each register has k-many cells, which are denoted as SZERO:[1-k] and SONE:[1-k]. SZERO stands for "Sticky ZEROs," and will be initialized to all ONEs, while SONE stands for "Sticky ONEs," and will be initialized to all ZEROs. Each cell of SZERO is the same, and each cell of SONE is the same, although the devices for initializing and for making SONE sticky are different from SZERO. Let us consider the cell of each register that receives the signal TR:1 (12); the other cells are each of the same respective construction.

At the heart of the first cell in SZERO is a D-type latch 13 that is also equipped with an asynchronous S input that SETs the latch upon the assertion of a signal INITIALIZE 14. This is how the k-many cells in SZERO get initialized to all ONEs. The Q output 17 of the latch 13 is taken not only as SZERO:1, but is also supplied as an input to an AND gate 18. The other input to the AND gate 18 is TR:1, and the output of that AND gate is the D input to the latch. The latch 13 is clocked with a signal 15 that is the inversion of DATA IN, supplied by an inverter 16 coupled to DATA IN. For now, ignore the significance of the inversion, and appreciate that, nevertheless, the latch 13 will be regularly clocked anyway. The "sticky ZERO" idea is that as long a TR:1 is a ONE at the time of clocking, both inputs to the AND gate 18 will be ONE, and a ONE will be re-circulated back into the latch. However, once TR:1 is ever a ZERO at the time of clocking, the output of the AND gate 18 will supply a ZERO to the D input, and henceforth the output of the AND gate will remain a ZERO, since the Q output 17 is now ZERO (which is also an input to the AND gate). This condition of a "stuck" ZERO will remain in force, from clock to clock, until there has been another instance of INITIALIZE 14.

The first cell of SONE is similar, and is also coupled to TR:1 and to INITIALIZE. At the heart of the first cell in SONE is a D-type latch 19 that is also equipped with an asynchronous C input that CLEARs the latch upon the assertion of the signal INITIALIZE 14. This is how the k-many cells in SONE get initialized to all ZEROs. The Q output 21 of the latch 19 is taken not only as SONE:1, but is also supplied as an input to an OR gate 22. The other input to the OR gate 22 is TR:1, and the output of the OR gate 22 is the D input to the latch. The latch is clocked with a signal 20 that is the actual (non-inverted) DATA IN. For now, ignore the significance of this, and appreciate that, nevertheless, the latch 19 will be regularly clocked anyway. The "sticky ONE" idea is that as long a TR:1 is a ZERO at the time of clocking, both inputs to the OR gate 22 will be ZERO, and a ZERO will be re-circulated back into the latch. However, once TR:1 is ever a ONE at the time of clocking, the output of the OR gate 22 will supply a ONE to the D input, and henceforth the output of the OR gate wilt remain a ONE, since the Q output 17 is now ONE (which is also an input to the OR gate). This condition of a "stuck" ONE will remain in force, from clock to clock, until there has been another instance of INITIALIZE 14.

At this point we have described the bulk of the hardware of interest (there is still a small amount of hardware to describe), but the reader will be forgiven if at this point she is still a little foggy about how it is that this simple hardware actually provides the UI(ONE) and UI(ZERO) that we say it does. The short answer is that when we want to get UI information we arrange that there be an instance of the signal INITIALIZE 14. Then we let the thing run for some period of time, say for several hundred or several thousand clock cycles of the bus 3. Then we get SZERO:[1-k] and SONE: [1-k] and process them, after which the results are utilized in whatever manner is appropriate. With that in mind, here is the longer answer.

At this point the diagram 23 can be studied to advantage. Note, however, that it is not a standard oscillographic waveform: time runs in the wrong direction. With a scope the beam is moving to the right and, owing to the synchronization of triggering, the trace appears to stand still. Here, we are interested in the contents of the various elements of the Time Ruler 5, and it, in a Newtonian sense, anyway, is not moving. So, we adopt the convention of a waveform that moves rightward in space from one element of the Time Ruler to the next as time passes. This requires us to pick a spot on the diagram that represents "NOW," but which is essentially arbitrary, and freeze the diagram as it appears at that instant. (It is as if we took spatial snapshot at a certain time.) We pick such a location in time that is more useful than some others, namely the point in time when a trailing edge of interest arrives at the entrance to the Time Ruler. We dwell on this topic only to ward off the evil that might arise if someone accidently took the diagram to be an ordinary oscillographic trace, and got temporarily flummoxed.

So, let us consider the situation for SZERO as a trailing edge of an isolated ONE arrives at the entrance to the Time Ruler 5. By the term "isolated" we mean a ONE that is both preceded and followed by a ZERO. We accept that such an event is not guaranteed to occur on any given bus cycle, but that it is bound to happen at least occasionally. We are prepared to wait until at least several, or even until many, such isolated ONEs have occurred before we unload SZERO. We will also, of course, remember that at the very beginning of the measurement for UI(ONE) an instance of INITIALIZE 14 set all the bits of SZERO to ONEs.

To continue, the inverter 16 arranges that the trailing edge of an isolated ONE provides the rising edge that clocks all the latches in SZERO. Now, if indeed we have an isolated ONE, TR:1 through some other Time Ruler element, say, TR:j, will all get ONEs (24) clocked into the corresponding latches of SZERO. The latches corresponding to TR:j+1 through TR:k will get ZEROs (because of the preceding ZERO). It is, of course, the next (following ZERO) that provides the transition (A) that is inverted by inverter 16 to cause the clocking of the latches of SZERO. Those ZEROs for TRj+1 through TR:k will activate the sticky ZERO property, and duly get stuck, as indicated by the diagonal shading 25. For the same reason, any subsequent isolated ONE that has, according to the Time Ruler's outputs, a shorter UI(ONE) will create a larger number of such stuck ZEROs at the end of that shorter ONE. Longer periods for subsequent isolated ONEs will NOT "unstick" the stuck ZEROs. This "trims" the indicated UI(ONE) to be the shortest observed length, in units of delay ΔT, at least for the duration of the measurement, so far.

We have treated the ZERO ONE ZERO case (an isolated ONE). Upon reflection, it is clear why the other possibilities (ZERO ONE ONE, ONE ONE ZERO, ONE ONE ONE and any case with ZERO in the middle) do not disturb the above-described results. That is, unless there is a subsequent ZERO (following the isolated ONE) there is no possibility of clocking SZERO at transition A, and SZERO remains undisturbed. And unless there was a preceding ZERO (far to the right in the diagram) there simply are no far right ZEROs to clock into SZERO and become stuck.

Now consider the corresponding case for SONE. It will, of course, previously have been initialized to all ZEROs. The trailing edge of an isolated ZERO provides the transition at B that clocks all the latches in SONE. Now, if indeed we have an isolated ZERO, TR:1 through some other Time Ruler element, say, TRj, will all get ZEROs (26) clocked into the corresponding latches of SONE. The latches corresponding to TRj+1 through TR:k will get ONEs (because of the preceding ONE). It is, of course, the next (following ONE) that provides the transition at B that causes the clocking of the latches of SONE. Those ONEs for TRj+1 through TR:k will activate the sticky ONE property, and duly get stuck, as indicated by the horizontal shading 27. For the same reason, any subsequent isolated ZERO that has, according to the Time Ruler's outputs, a shorter UI(ZERO) will create a larger number of such stuck ONEs at the end of that shorter ZERO. Longer periods for subsequent isolated ZEROs will NOT "unstick" the stuck ONEs. This "trims" the indicated UI(ZERO) to be the shortest observed length, in units of delay ΔT, at least for the duration of the measurement, so far.

We have treated the ONE ZERO ONE case (an isolated ZERO). Upon reflection, it is clear why the other possibilities (ONE ZERO ZERO, ZERO ZERO ONE, ZERO ZERO ZERO and any case with ONE in the middle) do not disturb the above-described results. That is, unless there is a subsequent ONE (following the isolated ZERO) there is no possibility of clocking at transition B, and SONE remains undisturbed. And unless there was a preceding ONE (far to the right in the diagram) there simply are no far right ONEs to clock into SONE and become stuck.

After some length of time, say a few hundred to a few thousand bus cycles, or whatever, SZERO:[1-k] and SONE:[1-k] have acquired their terminal values. That is, SZERO:[1-j] will be some string of consecutive ONEs indicating in Time Ruler units of ΔT the minimum observed value for UI(ONE). SONE:[1j] will likewise be some string of consecutive ZEROs indicating in Time Ruler units of ΔT the minimum observed value for UI(ZERO).

And now as to what to do with SZERO:[1-k] (the observed minimum value for UI(ONE)) and SONE:[1-k] (the observed minimum value for UI(ZERO)), once we have measured them. Although there are many possibilities here, we shall sketch only one, since, as mentioned earlier, our main concern here is with how to measure the UI, rather than what to do with the measurement once it is obtained. Accordingly, note Processing Circuit 28 whose output is coupled to a Variable Delay Circuit 29. Processing Circuit 28 combines the two UI measurements, which are UI(ONE) as represented by SZERO:[1-k] (30) and UI(ZERO) as represented by SONE:[1-k] (31), into a single unified measure that, say, for example, controls the amount of variable delay provided by Variable Delay Circuit 29. For example, a clock signal SYSCLK 32 that accompanies the signals of Data Bus 3, if symmetrical, could be inverted to provide SYSCLKNOT 33 that, when delayed by a half-cycle, could be the CLKD 34 that is used in place of SYSCLK. The amount of delay produced by the unified UI measurement would put the active edge of SYSCLKNOT at the right place in time to provide 50% set-up and hold for clocking the data signals of the Data Bus 3.

It will be noted that a unified UI could, for example, be the average of UI(ONE) and UI(ZERO), or the perhaps just the smaller of the two. These are system architecture choices that are now available, once both UI(ONE) and UI(ZERO) are available. There are, of course, many ways that UI(ONE) and UI(ZERO) can be combined to produce a unified output. Since each UI is, as we have drawn them, a field of bits that are exactly two adjoining strings of contiguous ONEs and contiguous ZEROs, those fields could be construed as binary numbers and operated upon by an ALU (Algorithmic Logic Unit) or other processing mechanism, such as a state machine, programmed logic array, or even a look-up table. If one were fond of look-up tables, one might note that a memory addressed by 2k-many bits would be required, and that if k were, say, ten, then the amount of memory used might seem out of proportion to the function it performs. This could be alleviated by encoding the in-line representation of the original fields for SZERO:[1-k] 30 and SONE:[1-k] 31 with binary encoders, whose numbers of output bits are considerably smaller. These binary encodings would then be applied to the look-up table, which could then be quite modest in size. Any of the other processing mechanisms might benefit from this approach, as well. On the other hand, the output of the Processing Circuit might wish to remain an in-line representation, for reasons indicated below.

We should note also, that it is perfectly practical to measure only one of UI(ONE) and UI(ZERO), and do whatever is useful with only the one value for UI.

It will be appreciated that we have measured the UI in terms of the delays provided by the Time Ruler 5, and have not bothered to convert its units of ΔT into actual absolute time values, such as so many microseconds or so many nanoseconds. It is true that the bits in the SZERO:[1-k] 30 and SONE:[1-k] 31 are a symbolic representation, just as the text "100.0 nsec" is, but there is a handy difference here. We can easily arrange for the using Variable Delay Circuit 29 (or other utilizing circuit) to incorporate the same style of delay elements that are used in the Time Ruler 5. That is, it can incorporate a second Time Ruler that is "used in reverse," as it were. If the measurement is (indicates) that we need nine units of delay 1-9, then a comparable nine units of delay can be switched in to provide an identical behavior. This approach is aided if the output of the Processing Circuit is an in-line indication (like SONE:[1-k] (31)), as opposed to an encoded output. In any case, we don't need to know what the actual absolute delay of each delay element, or of the combined nine delay elements, really is. Of course, there is nothing that says we can't provide a switched-in delay of nine and one half units of delay, if the processing mechanism produces a unified result having such a fractional portion (say, from the averaging of the values "nine" and "ten"). That just means that compensatory delay units in the second Time Ruler having suitable fractional values would be useful if available.

We also note the following observation. Let's say you built the thing as outlined using ten delay elements in the Time Ruler: k equals ten. Upon reflection, you discover that a (maximum!) step size often percent of the UI is too coarse, and consider letting k be twenty, or even higher, but are dismayed by the IC real estate that would be consumed. Not to worry. Also suppose that you decide that a worst case of a ten percent change in UI is all that would ever have to be dealt with. So, let k be twelve, and also arrange that TR:1 be 90% of the nominal UI, with ΔT for the other TR:i set at 2%. Now, TR:1 plus TR:[2-5] are 100%, and the measurement can range all the way down to just 90% with TR:1 alone and range up to 110% with the full TR:0 plus TR:[2-12], all in step of 2%. Isn't that sweet? Just be sure that the corresponding delay for TR:1 in the Variable Delay Circuit 29 (or other compensatory value for the second Time Ruler in another responding circuit) matches the 90% of the nominal UI that TR:1 has, and that the other remaining delays are also the 2% ΔT.

It will be appreciated that UI is unlikely to change abruptly, but instead can be expected to drift over time according to temperature and other parameters. It is envisioned that the technique described herein can be employed periodically, or on an as needed basis, to discover the present Unit Interval. That said, it could also be monitored continuously, if such were desired.

Finally, it will be appreciated that there are alternatives to the particular way the "stickiness" of the latches, or cells, of the registers SONE and SZERO can be realized. The particular arrangement shown in the Figure is one that is well suited for use with D-type latches, although there are other suitable arrangements. We could say that the circuit of FIG. 1 creates a "sticky" ONE by actively re-circulating that logical value once it appears after an initialization to ZERO. (A "sticky" ZERO actively re-circulates a ZERO after an initialization to a ONE.) The motivation here is that, for D-type latches the logical value at the D input has to be correctly determined for each clock cycle. There could well be other circuit arrangements that produce the same effect, but that are slightly different. Suppose Set-Reset or JK flip flops were used as register elements, instead; a different strategy might then be attractive. So, for Set-Reset flip-flops, it might be convenient to arrange the logic to operate so that, for SZERO, at the time the trailing edge of the isolated ONE enters the Time Ruler, no ONEs are ever coupled from the output of the Time Ruler to the S inputs of SZERO, while allowing signals to reach the R inputs. Then once SZERO was initialized to all ONEs, it would, from a distance, appear to have sticky ZEROs. SONE, initialized to all ZEROs, would work in a similar fashion, with no coupling from the Time Ruler to the R inputs, but with such coupling to the S inputs of SONE. With this scheme, we "accumulate" the result, much like fallen bowling pins accumulate the result of rolling two bowling balls for one frame.

I claim:

1. A method of measuring, for a signal S, the Unit Interval of a logical ONE, the method comprising the steps of:
   (a) initializing a register R of k-many cells R:[1-k] to all ONEs; and then subsequently
   (b) delaying each transition in the signal S by selected amounts of k-many successive consecutive delays to produce a respective collection of Delayed Signals DS:[1-k], DS:(i+1) being delayed from DS: i, i=1, 2, . . . , k-1, the cumulative amount of delay from a transition in S to the corresponding transition in DS:k being at least as long as the longest unit interval to be measured;
   (c) clocking logical ZEROs among the DS:[1-k] into the corresponding and respective cells R:[1-k] upon a ONE-to-ZERO transition in the signal S to clear those cells while not using any ONEs to set their respective cells;
   (d) repeating steps (b) and (c) for a selected duration; and then
   (e) capturing the values of the k-many cells R:[1-k] and taking remaining ONEs therein as an indication, in units corresponding to the consecutive delays, of the Unit Interval of a logical ONE for the signal S.

2. A method as in claim 1 further comprising the step of selecting in step (b) each of the k-many delays to be equal.

3. A method as in claim 1 further comprising the step of selecting in step (b) at least the delay for producing DS:1 to be significantly greater than the delays for producing the other DS:i.

4. A method of measuring, for a signal S, the Unit Interval of a logical ZERO, the method comprising the steps of:
   (a) initializing a register R of k-many cells R:[1-k] to all ZEROs; and then subsequently
   (b) delaying each transition in the signal S by selected amounts of k-many successive consecutive delays to produce a respective collection of Delayed Signals DS:[1-k], DS:(i+1) being delayed from DS:i, i=1, 2, . . . , k-1, the cumulative amount of delay from a transition in S to the corresponding transition in DS:k being at least as long as the longest unit interval to be measured;
   (c) clocking logical ONEs among the DS:[1-k] into the corresponding and respective cells R:[1-k] upon a ZERO-to-ONE transition in the signal S to set those cells while not using any ZEROs to clear their respective cells;
   (d) repeating steps (b) and (c) for a selected duration; and then
   (e) capturing the values of the k-many cells R:[1-k] and taking remaining ZEROs therein as an indication, in units corresponding to the consecutive delays, of the Unit Interval of a logical ZERO for the signal S.

5. A method as in claim 4 further comprising the step of selecting in step (b) each of the k-many delays to be equal.

6. A method as in claim 4 further comprising the step of selecting in step (b) at least the delay for producing DS:1 to be significantly greater than the delays for producing the other DS:i.

7. A method of measuring the Unit Interval for a signal S, the method comprising the steps of:
   (a1) initializing a register RONE of k-many cells RONE:[1-k] to all ONEs; and also (a2) initializing a register RZERO of k-many cells RZERO:[1-k] to all ZEROs; and then subsequently
   (b) delaying each transition in the signal S by selected amounts of k-many successive consecutive delays to produce a respective collection of Delayed Signals DS:[1-k], DS:(i+1) being delayed from DS:i, i=1, 2, . . . , k-1, the cumulative amount of delay from a transition in S to the corresponding transition in DS:k being at least as long as the longest unit interval to be measured;
   (c1) clocking logical ZEROs among the DS:[1-k] into the corresponding and respective cells RONE:[1-k] upon a ONE-to-ZERO transition in the signal S to clear those cells while not using any ONEs to set their respective cells;
   (c2) clocking logical ONEs among the DS:[1-k] into the corresponding and respective cells RZERO:[1-k] upon a ZERO-to-ONE transition in the signal S to set those cells while not using any ZEROs to clear their respective cells;

(d) repeating steps (b), (c1) and (c2) for a selected duration; and then (e1) capturing the values of the k-many cells RONE:[1-k] and taking remaining ONEs therein as an indication, in units corresponding to the consecutive delays, of the Unit Interval of a logical ONE for the signal S; and also (e2) capturing the values of the k-many cells RZERO:[1-k] and taking remaining ZEROs therein as an indication, in units corresponding to the consecutive delays, of the Unit Interval of a logical ZERO for the signal S.

8. A method as in claim 7 further comprising the step of selecting in step (b) each of the k-many delays to be equal.

9. A method as in claim 7 further comprising the step of selecting in step (b) at least the delay for producing DS:1 to be significantly greater than the delays for producing the other DS:i.

10. A method as in claim 7 further comprising the step of combining into a single value the values captured and taken in steps (e1) and (e2).

11. A method as in claim 10 wherein the step of combining is averaging.

\* \* \* \* \*